(12) United States Patent
Kamata et al.

(10) Patent No.: US 12,297,562 B2
(45) Date of Patent: May 13, 2025

(54) SILICON CARBIDE INGOT INCLUDING SCREW DISLOCATIONS

(71) Applicants: MIRISE Technologies Corporation, Nisshin (JP); DENSO CORPORATION, Kariya (JP); TOYOTA JIDOSHA KABUSHIKI KAISHA, Toyota (JP)

(72) Inventors: Isaho Kamata, Tokyo (JP); Norihiro Hoshino, Tokyo (JP); Kiyoshi Betsuyaku, Tokyo (JP); Hidekazu Tsuchida, Tokyo (JP); Takeshi Okamoto, Nisshin (JP); Akiyoshi Horiai, Nisshin (JP)

(73) Assignees: 1)MIRISE Technologies Corporation, Nisshin (JP); 2)DENSO CORPORATION, Kariya (JP); 3)TOYOTA JIDOSHA KABUSHIKI KAISHA, Toyota (JP)

( * ) Notice: Subject to any disclaimer, the term of this patent is extended or adjusted under 35 U.S.C. 154(b) by 66 days.

(21) Appl. No.: 18/060,071

(22) Filed: Nov. 30, 2022

(65) Prior Publication Data
US 2023/0193510 A1 Jun. 22, 2023

(30) Foreign Application Priority Data
Dec. 17, 2021 (JP) .................. 2021-205391

(51) Int. Cl.
*C30B 29/36* (2006.01)
*C30B 23/00* (2006.01)
(Continued)

(52) U.S. Cl.
CPC ............ *C30B 29/36* (2013.01); *C30B 23/002* (2013.01); *C01B 32/956* (2017.08); *H10D 62/822* (2025.01); *H10D 62/8325* (2025.01)

(58) Field of Classification Search
CPC ..... C30B 29/36; C30B 23/002; C30B 25/183; H01L 29/1608; H01L 29/165; C01B 32/956
See application file for complete search history.

(56) References Cited

U.S. PATENT DOCUMENTS 5,787,104 A * 7/1998 Kamiyama ......... H01S 5/34333
372/43.01
6,716,655 B2 * 4/2004 Nagai ................... H01L 33/007
257/E21.127
(Continued)

FOREIGN PATENT DOCUMENTS

CA 2551209 A1 * 12/2006 ....... H01L 21/02447
JP 2001247397 A * 9/2001 ........... H01L 29/861
(Continued)

*Primary Examiner* — Ida M Soward
(74) *Attorney, Agent, or Firm* — Posz Law Group, PLC

(57) ABSTRACT

A silicon carbide ingot having micropipes in a seed crystal closed and being reduced in the gathering of screw dislocations, a method for manufacturing the silicon carbide ingot, and a method for manufacturing a silicon carbide wafer are provided. The silicon carbide ingot includes a seed crystal composed of a silicon carbide single crystal and having micropipes being hollow defects; a buffer layer provided on the seed crystal and composed of silicon carbide; and a bulk crystal growth layer provided on the buffer layer and composed of silicon carbide. The buffer layer and the bulk crystal growth layer have a plurality of screw dislocations continuous with the micropipes closed with the buffer layer, and the plurality of screw dislocations having the micropipe in common in the bulk crystal growth layer are 150 um or more apart from each other.

2 Claims, 2 Drawing Sheets

(51) Int. Cl.
    *C01B 32/956*     (2017.01)
    *H10D 62/822*     (2025.01)
    *H10D 62/832*     (2025.01)

(56) References Cited

U.S. PATENT DOCUMENTS

| | | | |
|---|---|---|---|
| 2007/0032053 A1* | 2/2007 | Seki | H01L 21/02507 257/E29.104 |
| 2011/0203513 A1* | 8/2011 | Watanabe | H01L 21/02378 117/54 |
| 2011/0221039 A1* | 9/2011 | Singh | H01L 21/30617 438/492 |
| 2013/0199438 A1* | 8/2013 | Nagai | C30B 19/02 117/58 |
| 2020/0020777 A1* | 1/2020 | Fujikawa | C30B 23/025 |
| 2021/0355598 A1* | 11/2021 | Hashimoto | C30B 7/105 |

FOREIGN PATENT DOCUMENTS

| | | | | |
|---|---|---|---|---|
| JP | 4044053 B | | 11/2007 | |
| JP | 2016127201 A | * | 7/2016 | H01L 21/205 |
| JP | 2018-140903 A | | 9/2018 | |
| WO | WO-9901593 A2 | * | 1/1999 | C30B 25/02 |
| WO | WO-0117002 A1 | * | 3/2001 | H01L 21/02381 |
| WO | WO-2005112080 A1 | * | 11/2005 | H01L 21/02389 |

* cited by examiner

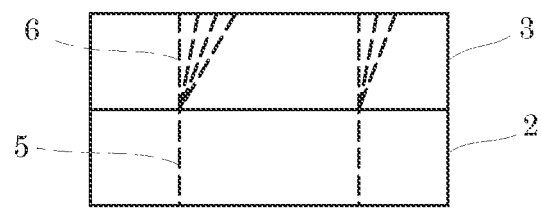
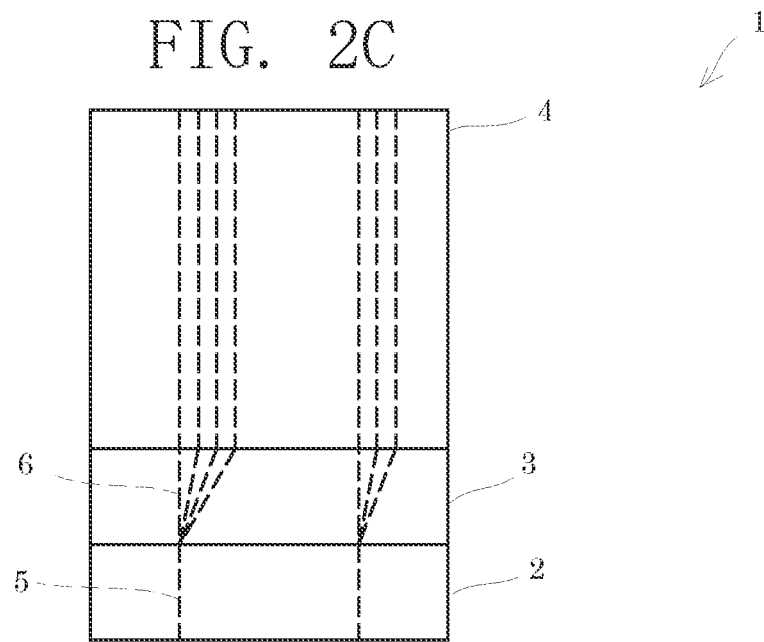

SILICON CARBIDE INGOT INCLUDING SCREW DISLOCATIONS

CROSS REFERENCE TO RELATED APPLICATIONS

The present application is a U.S. Paris Convention application, which is based on and claims the benefit of priority of the prior Japanese Patent Application No. 2021-205391 filed on Dec. 17, 2021, the entirety of which is incorporated herein by reference.

The entire disclosure of Japanese Patent Application No. 2021-205391 filed on Dec. 17, 2021 is expressly incorporated by reference herein.

TECHNICAL FIELD

This invention relates to a silicon carbide ingot, a method for manufacturing a silicon carbide ingot, and a method for manufacturing a silicon carbide wafer.

BACKGROUND ART

Silicon carbide (may hereinafter be referred to as SiC) is a semiconductor exhibiting excellent physical property values—a bandgap about 3 times as wide as, a saturation drift velocity about 2 times as high as, and a dielectric breakdown field strength about 10 times as high as, those of Si—and having a great thermal conductivity. Thus, it is expected as a material which realizes a next generation high voltage, low loss semiconductor device delivering performance markedly surpassing the performance of the Si single crystal semiconductor currently in use.

As one of methods for manufacturing SiC wafers for use in such semiconductor devices, a sublimation method is known. If hollow defects called micropipes are contained in a seed crystal, the formation of a single crystal layer composed of SiC (will hereinafter be called a bulk crystal growth layer) on the seed crystal by the sublimation method results in the continuation of the micropipes into the bulk crystal growth layer as well.

To solve the above-mentioned problem of micropipes, Patent Document 1 discloses a method for manufacturing an SiC single crystal film, which comprises performing epitaxial growth by the CVD method using a source gas containing C and Si in an Si-rich state. According to this manufacturing method, when an epitaxial film with a thickness of the order of 100 to 150 μm is grown at a growth rate of several tens of micrometers/h, the micropipes are decomposed into a plurality of 1 c screw dislocations, so that an SiC single crystal film reduced in the continuation of the micropipes from the seed crystal is obtained. Even after the micropipes are closed and decomposed, however, in case the plurality of 1 c screw dislocations fail to diffuse in a sufficiently spaced state (at a distance of the order of 10 μm), the screw dislocations locally gather, leading to low crystallinity.

PRIOR ART LITERATURES

Patent Documents

Patent Document 1: Japanese Patent No. 4044053

SUMMARY OF INVENTION

Problems to be Solved by the Invention

The present invention has been accomplished in the light of the above-described circumstances. It is an object of this invention to provide a silicon carbide ingot having micropipes in a seed crystal closed and being reduced in the gathering of screw dislocations; a method for manufacturing the silicon carbide ingot; and a method for manufacturing a silicon carbide wafer.

Means for Solving the Problems

An aspect of the present invention for attaining the above object is a silicon carbide ingot comprising: a seed crystal composed of a silicon carbide single crystal and having micropipes being hollow defects; a buffer layer provided on the seed crystal and composed of silicon carbide; and a bulk crystal growth layer provided on the buffer layer and composed of silicon carbide, wherein the buffer layer and the bulk crystal growth layer have a plurality of screw dislocations continuous with the micropipes closed with the buffer layer, and the plurality of screw dislocations having the micropipe in common in the bulk crystal growth layer are 150 μm or more apart from each other.

Another aspect of the present invention for attaining the above object is a method for manufacturing a silicon carbide ingot, comprising: a first step of forming a buffer layer composed of silicon carbide on a seed crystal composed of a silicon carbide single crystal and having micropipes being hollow defects; and a second step of forming a bulk crystal growth layer composed of silicon carbide on the buffer layer, wherein in the first step, the buffer layer with a thickness of 100 μm or more is formed at a temperature of 2400° C. or higher by a gas method using a source gas having a number ratio between carbon atoms and silicon atoms (C/Si ratio) of 0.5 or higher, but 0.9 or lower, while in the second step, the bulk crystal growth layer is formed by a gas method or a sublimation method.

Still another aspect of the present invention for attaining the above object is a method for manufacturing a silicon carbide wafer, comprising: forming a silicon carbide ingot by the above-mentioned method for manufacturing a silicon carbide ingot; and slicing the bulk crystal growth layer.

Effects of the Invention

According to the present invention, there are provided a silicon carbide ingot having micropipes in a seed crystal closed and being reduced in the gathering of screw dislocations; a method for manufacturing the silicon carbide ingot; and a method for manufacturing a silicon carbide wafer.

BRIEF DESCRIPTION OF DRAWINGS

FIGS. 2A to 2C are views showing a method for manufacturing the SiC ingot.

MODE FOR CARRYING OUT INVENTION

Figure 1A:
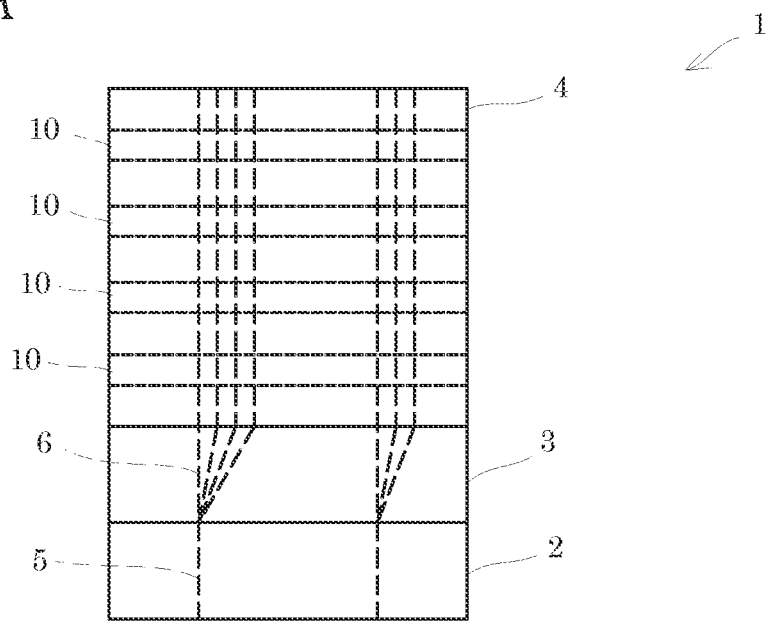
FIG. 1A is a front view of an SiC ingot.

FIG. 1A is a front view of an SiC ingot according to an embodiment of the present invention. An SiC ingot 1 comprises a seed crystal 2, a buffer layer 3 provided on one surface side of the seed crystal 2, and a bulk crystal growth layer 4 provided on one surface side (a side opposite to the side where the seed crystal 2 is located) of the buffer layer 3.

The seed crystal 2 is composed of an SiC single crystal having micropipes 5. The seed crystal 2 is not limited in terms of its manufacturing method, but is formed, for example, by a sublimation method.

The micropipes 5 are hollow defects each measuring several hundred nanometers to several micrometers in diameter. Each micropipe 5 has a Burgers vector of nc, and is considered to be a large screw dislocation. A threading screw dislocation which is not hollow, on the other hand, has a Burgers vector of 1 c, and propagates in the c-axis direction of the SiC crystal. (Here, the threading screw dislocation is considered to include a threading mixed dislocation, b=c+ a/3<11−20>, having an a-component Burgers vector as well, in addition to a pure screw dislocation having a Burgers vector b of b=1 c.)

The buffer layer 3 is a layer composed of SiC. The buffer layer 3 has a thickness of 100 μm or more, and is formed under Si-rich conditions having an atomic number ratio between carbon atoms and silicon atoms (hereinafter, C/Si ratio) of 0.5 or higher, but 0.9 or lower.

In the buffer layer 3, the micropipes 5 residing in the seed crystal 2 are closed, and the closed micropipes 5 are decomposed into a plurality of screw dislocations 6. Concretely, the one micropipe 5 having a Burgers vector of nc is decomposed into n number of screw dislocations 6. Hereinafter, the plurality of screw dislocations 6 ascribed to the common micropipe 5 and identical in sense (structurally, the screw dislocation has a left-handed spiral sense or a right-handed spiral sense) are referred to as "screw dislocations 6 of the same sense". FIG. 1A shows two of "the screw dislocations 6 of the same sense having the micropipe 5 in common". All the micropipes 5 are closed with the buffer layer 3.

In the buffer layer 3, the screw dislocations 6 of the same sense have a repulsive force working against each other, so that they are spaced widely and diffuse. This diffusion of the screw dislocations is achieved by forming the buffer layer 3 having a predetermined thickness, for example, 100 μm or more, by a gas method to be described later.

The bulk crystal growth layer 4 is a layer formed on the buffer layer 3 by bulk growth and composed of an SiC single crystal. Into the bulk crystal growth layer 4, the screw dislocations 6 continue from the buffer layer 3. In the bulk crystal growth layer 4, at least the screw dislocations 6 of the same sense are spaced from each other by 150 μm or more. The C/Si ratio at the time of formation of the bulk crystal growth layer 4 is at least higher than the C/Si ratio of the buffer layer 3.

Figure 1B:
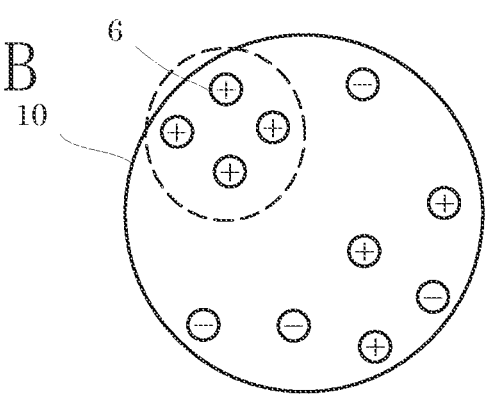
FIGS. 1B and 1C are plan views of SiC wafers.
Figure 1C:
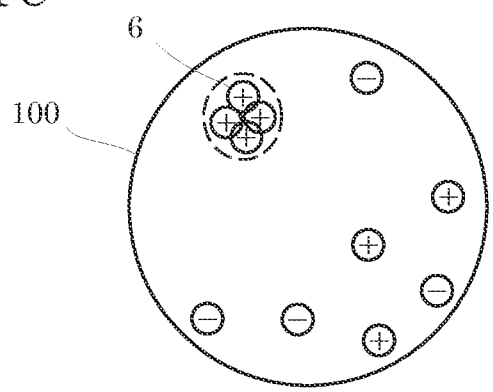

FIG. 1B is a plan view of an SiC wafer 10 obtained by slicing the bulk crystal growth layer 4 of the SiC ingot 1. FIG. 1C is a plan view of an SiC wafer 100 which is a comparative example. In these drawings, signs "+" in circles indicating the screw dislocations 6 represent left-handed spirals, whereas signs "−" in circles indicating the screw dislocations 6 represent right-handed spirals.

The SiC wafer 10 shown in FIG. 1B is a slice of the bulk crystal growth layer 4 of the SiC ingot 1. The signs "+" surrounded by a dashed circle represent the screw dislocations 6 of the same sense "+". In the plan view, the screw dislocations 6 of the same sense are spaced from each other by 150 μm or more. That is, when one of the plurality of screw dislocations 6 of the same sense is noticed, its distance from any of the other screw dislocations 6 is 150 μm or more.

An SiC wafer 100 shown in FIG. 1C is a wafer having micropipes closed with an epitaxial film formed by CVD. The CVD method involves a film formation rate of several tens of micrometers/hour and, even when it grows an epitaxial film with a thickness of the order of 100 to 150 μm, screw dislocations diffuse only at a spacing of the order of 10 μm. The screw dislocations 6 of the same sense "+" surrounded by a dashed circle do not diffuse widely, but gather, in the plan view. As noted here, the conventional SiC epitaxial wafer according to the CVD method has the micropipes 5 of the seed crystal 2 closed, but in the bulk crystal growth layer 4, the screw dislocations locally gather, thus resulting in low crystallinity.

On the other hand, the SiC ingot 1 of the present invention and its SiC wafer 10, shown in FIG. 1B, have the screw dislocations 6 of the same sense diffused at sufficient distances, owing to their repulsive forces against each other, thus leading to highly uniform satisfactory crystals.

By reference to FIGS. 2A to 2C, an explanation will be offered for a method for manufacturing the above-mentioned SiC ingot 1 and SiC wafer 10. The method for manufacturing the SiC ingot 1 comprises a first step and a second step.

In the first step, the buffer layer 3 shown in FIG. 2B is formed by the gas method (high temperature CVD method) on one surface side of the seed crystal 2 having the micropipes 5 (shown in FIG. 2A). The thickness of the resulting buffer layer 3 is preferably at least 100 μm, preferably 1 mm or more. Since the gas method involves a growth rate of several millimeters/hour, it can form a thick crystal (a buffer layer or a bulk crystal) in a short time as compared with the CVD method.

A source gas for use in the gas method of the first step has a composition for growing SiC. As an example, there can be used a mixture of various gases such as $SiH_4$ as an Si-based reactive species, $C_3H_8$ as a carbon-based reactive species, and $H_2$ or Ar as a carrier gas. The ratio of C/Si contained in the source gas is preferably 0.9 or lower, further 0.5 or higher, but 0.9 or lower. Moreover, the C/Si ratio during the formation of the buffer layer 3 may be fixed, or may be changed.

The pressure of the source gas in the gas method of the first step is $1.013 \times 10^2$ Pa or more, but $1.013 \times 10^5$ Pa or less. The temperature of the source gas is preferably 2400° C. or higher, further 2400° C. or higher, but 2600° C. or lower.

According to the foregoing first step, the micropipes of the seed crystal 2 are closed with the buffer layer 3 formed using the Si-rich source gas, and decomposed into the plurality of screw dislocations 6 gathered. In the case of the buffer layer 3 formed by the gas method which performs growth at a high temperature and a high crystal growth rate, the screw dislocations 6 of the same sense easily diffuse in comparison with the CVD method which forms a thin film. When the buffer layer 3 is grown to a thickness of several millimeters or more, therefore, the bulk crystal growth layer 4 formed subsequently has the screw dislocations 6 diffused with a sufficient spacing being retained from each other, resulting in a highly uniform satisfactory crystal.

As shown in FIG. 2C, the second step forms the bulk crystal growth layer 4 on the buffer layer 3. There is no particular limitation on the thickness of the bulk crystal growth layer 4. In the present embodiment, the gas method is used as in the first step. In connection with the manufacturing conditions, however, the source gas having the C/Si ratio suitable for the bulk growth of an SiC single crystal (this ratio is at least higher than the C/Si ratio in the first step) is used. The pressure and the temperature may be the same as or different from those in the first step. By so doing, in the bulk crystal growth layer 4, the spacing between the screw dislocations 6 of the same sense is sufficiently ensured, resulting in a highly uniform satisfactory crystal.

Generally, the gas method can change the C/Si ratio even while forming a crystal. Since the second step uses the same gas method as in the first step, therefore, a mere change in the C/Si ratio of the source gas is sufficient to form the bulk crystal growth layer 4 efficiently. The second step is not limited to the gas method, but may be performed by a sublimation method.

The resulting bulk crystal growth layer 4 of the SiC ingot 1 is sliced to obtain the SiC wafer 10. The SiC wafer 10 has a highly uniform satisfactory crystal in which the diffusion of the screw dislocations 6 is promoted.

As described above, the SiC ingot 1 of the present invention comprises the seed crystal 2 having the micropipes 5, the buffer layer 3, and the bulk crystal growth layer 4, wherein the buffer layer 3 and the bulk crystal growth layer 4 have the plurality of screw dislocations 6 continuous with the micropipes 5 closed with the buffer layer 3, and in the bulk crystal growth layer 4, the plurality of screw dislocations 6 of the same sense are 150 μm or more apart from each other. The SiC ingot 1 of this configuration is a high quality one having the micropipes 5 closed and the screw dislocations 6 diffused. The SiC wafer 10 formed from the SiC ingot 1 of such a configuration is one having a highly uniform satisfactory crystal free from the micropipes 5 and having the screw dislocations 6 diffused acceleratedly.

In the SiC ingot 1, the thickness of the buffer layer 3 is preferably 100 μm or more. According to this feature, the SiC ingot 1 comprises a highly uniform satisfactory crystal containing the screw dislocations 6 of the same sense diffused with wide spacings.

The SiC ingot 1 is preferably formed under such Si-rich conditions that the atomic number ratio between carbon atoms and silicon atoms (C/Si ratio) in the buffer layer 3 is 0.5 or higher, but 0.9 or lower. According to this feature, a high quality SiC ingot having the micropipes 5 closed more reliably is provided.

The method for manufacturing the SiC ingot 1 of the present invention comprises the first step of forming the buffer layer 3 on the seed crystal 2, and the second step of forming the bulk crystal growth layer 4 on the buffer layer 3. In the first step, the buffer layer with a thickness of 100 μm or more is formed at a temperature of 2400° C. or higher by the gas method using the source gas having the C/Si ratio in an Si-rich manner. In the second step, the bulk crystal growth layer 4 is formed by the gas method or the sublimation method. By so doing, there can be manufactured the SiC ingot 1 of a high quality having the micropipes 5 closed and the screw dislocations 6 diffused. From this SiC ingot 1, the SiC wafer 10 can be formed. The so configured process is capable of manufacturing the SiC wafer 10 having a highly uniform satisfactory crystal which is free from the micropipes 5 and in which the diffusion of the screw dislocations 6 is promoted.

With the method for manufacturing the SiC ingot 1, moreover, the bulk crystal growth layer 4 is formed in the second step by the gas method using the source gas having the C/Si ratio higher than in the first step. The second step employs the same gas method as in the first step. By merely changing the C/Si ratio, therefore, the bulk crystal growth layer 4 can be formed uninterruptedly. Hence, the SiC ingot 1 can be manufactured efficiently.

EXPLANATIONS OF LETTERS OR NUMERALS

1 SiC ingot
2 Seed crystal
3 Buffer layer
4 Bulk crystal growth layer
5 Micropipe
6 Screw dislocation
10 SiC wafer

What is claimed is:

1. A silicon carbide ingot, comprising:
    a seed crystal composed of a silicon carbide single crystal and having micropipes being hollow defects;
    a buffer layer provided on the seed crystal and composed of silicon carbide; and
    a bulk crystal growth layer provided on the buffer layer and composed of silicon carbide,
    wherein the buffer layer and the bulk crystal growth layer have a plurality of screw dislocations continuous with the micropipes closed with the buffer layer,
    the plurality of screw dislocations having the micropipe in common in the bulk crystal growth layer are 150 μm or more apart from each other,
    the buffer layer comprises silicon-rich silicon carbide with a thickness of 100 μm or more, and
    the buffer layer is formed at a temperature of 2400° or higher by a gas method using a source gas having an atomic number ratio between carbon atoms and silicon atoms (C/Si ratio) of 0.5 or higher, but 0.9 or lower.

2. The silicon carbide ingot according to claim 1, wherein the buffer layer has a thickness of 1 mm or more.

* * * * *